United States Patent [19]

Andrews, Jr. et al.

[11] Patent Number: 5,140,299
[45] Date of Patent: Aug. 18, 1992

[54] ARTICLE COMPRISING A HIGH VALUE RESISTOR

[75] Inventors: John M. Andrews, Jr., Alexandria, Va.; San-Chin Fang, New Providence, N.J.

[73] Assignee: AT&T Bell Laboratories, Murray Hill, N.J.

[21] Appl. No.: 541,102

[22] Filed: Jun. 19, 1990

[51] Int. Cl.$^5$ ............................................. H01C 1/012
[52] U.S. Cl. ................................... 338/308; 357/51; 357/6
[58] Field of Search ...................... 338/308, 306, 314; 357/51, 47, 48, 49, 50, 59, 54, 34, 6; 427/101; 437/918

[56] References Cited

U.S. PATENT DOCUMENTS

| | | | |
|---|---|---|---|
| 3,568,010 | 3/1971 | Maserjian | 357/54 X |
| 3,983,264 | 9/1976 | Schroen et al. | 427/39 |
| 4,926,232 | 5/1990 | Ando et al. | 357/34 |
| 4,975,750 | 12/1990 | Hayashi et al. | 357/6 |

OTHER PUBLICATIONS

*VLSI Technology*, McGraw-Hill Book Company, New York, NY, 1983, by S. M. Sze, pp. 474–475.

*Journal Of Applied Physics*, vol. 40, No. 1, Jan., 1969, "Fowler–Nordheim Tunneling into Thermally Grown SiO$_2$", by M. Lenzlinger et al., p. 278.

*The Theory of Electrical Conduction and Breadkown in Solid Dielectrics*, Clarendon Press, Oxford University, 1973 by J. J. O'Dwyer, pp. 136–137.

*The Bell System Technical Journal*, vol. 62, No. 4, Apr. 1983, "A Lithographic Mask System for MOS Fine-Line Process Development", by J. M. Andrews, pp. 1107–1125.

*Primary Examiner*—Marvin M. Lateef
*Attorney, Agent, or Firm*—M. I. Finston; E. E. Pacher

[57] ABSTRACT

In an electronic circuit that normally includes a high-value resistor, the resistive function may be usefully provided by a thin dielectric layer. Electric current is transported through the layer by quantum tunneling. In one embodiment, a resistor useful for VLSI applications is provided, requiring only a single contact window.

8 Claims, 4 Drawing Sheets

ARTICLE COMPRISING A HIGH VALUE RESISTOR

FIELD OF THE INVENTION

The invention relates to semiconductor integrated circuits comprising load resistors, and more particularly, to silicon MOS integrated circuits such as SRAMs with integrated load resistors.

ART BACKGROUND

One important VLSI device is the static, random-access memory (SRAM). A typical single cell of an SRAM comprises a pair of access transistors to transmit data into and out of the cell, a flip-flop, and a pair of loads for the two transistors that make up the flip-flop. The loads may be, for example, depletionmode transistors, but often they are high-value resistors. Typically, load resistances of $10^8$ to $10^{12}$ ohms are used, but even higher resistances may be desirable in order to limit the power dissipated by an operating memory. As a practical matter, resistances greater than $10^{14}$ ohms are undesirable because it is difficult to manufacture a reproducible and stable resistor at such resistance values, and because of spatial constraints on the memory chip. As a general rule, resistors are formed in VLSI circuits as thin strip-like films, which may be either straight or serpentine and are of uniform thickness. As is well known in the art, the total resistance of such structures is evaluated by enumerating the number of squares. That is, a thin-film resistor may be viewed as a series combination of resistors, each consisting of one square section whose transverse dimension (i.e., width) is the full width of the strip, and whose longitudinal dimension (i.e., length) is equal to the transverse dimension. The resistance of each such "square" is equal to the resistivity of the material, multiplied by the length of the square, and divided by the product of the thickness times the width of the square. Because the length and width cancel in the preceding formula, it is clear that the resistance of each square depends only on the resistivity divided by the film thickness. This quantity is called the sheet resistance.

In principle, a thin film could be made arbitrarily narrow, thereby creating arbitrarily many squares of resistance in any given space on a chip. In practice, however, a thin film strip can be made no narrower than the resolution of the lithographic processes used to create it. As a consequence, it is not practical to fabricate a thin-film resistor less than 0.5 $\mu$m in width. Resistance can also be raised, in principle, by making the resistive film arbitrarily thin. In practice, however, such a film cannot be substantially less than 100 Å in thickness, because films tend to become discontinuous when the thickness is less than the granularity of the deposited material.

For the reasons described above, it is difficult to fabricate a thin-film resistor having a sheet resistance of more than about $10^{10}$ ohms per square. As a consequence, the load resistors occupy a minimum of about 30% of the total area occupied by a typical memory cell.

High-value resistors for VLSI applications are often made from polycrystalline silicon (polysilicon) that has been ion-implanted to provide the desired resistance. Ion implantation is able to produce stable and reproducible resistance values in polysilicon resistors greater than $10^7$ $\Omega$. Moreover, chip area can be saved by fabricating the load resistors in a polysilicon layer overlying the active area of the memory cell, as described, for example, in S. M. Sze, *VLSI Technology*, McGraw-Hill Book Company, New York, 1983, pp. 474-475.

In a typical fabrication sequence (as described, e.g., in Sze, op. cit., at pp. 463-464), the second-level polysilicon is initially separated from the source and drain contacts by an oxide layer. That is, after the polysilicon gate material is deposited and doped, and after the source and drain regions are doped by ion implantation through overlying highly doped polysilicon contact regions, the wafers are typically oxidized to provide a dielectric for isolation between the two polysilicon levels. A second oxide, typically a phosphorus-doped CVD silicon oxide, is then deposited. Contact windows are then etched down to the polysilicon source and/or drain contacts (for one end of each resistor), and down to the polysilicon power or ground strips (for the other end of each resistor).

Unfortunately, polysilicon resistors are disadvantageous in some applications where they make contact with the source or drain regions of MOS transistors. That is, when a polysilicon resistor is fabricated in juxtaposition with a highly doped polysilicon source or drain contact, dopants readily diffuse from the contact into the resistor at the elevated temperatures characteristic of subsequent processing steps, such as the densification of the CVD oxide. The diffusion of dopants into the resistors decreases the resistance, reducing their usefulness.

Thus, it is desirable to provide a resistor valued at greater than $10^7$ $\Omega$ that occupies substantially reduced chip area per ohm of resistance, and that can be deposited in direct juxtaposition with a highly doped polysilicon contact without suffering from the effects of dopant diffusion. Because the etching of contact windows between the first and second polysilicon layers adds cost and consumes additional area on the chip, it is still more desirable to provide such a resistor which, additionally, requires at most one contact window rather than the two windows currently required.

SUMMARY OF THE INVENTION

It has been discovered that a high-value load resistor can be made by a process that comprises depositing or growing a thin dielectric layer, within a contact window, over a contact region of an active electronic device such as a transistor. The resistor made in this way does not conduct electricity ohmically. Instead, electric current passes through the resistor by quantum tunneling. Accordingly, such a resistor is here called a tunneling resistor. Because the tunneling resistor is deposited or grown within a contact window, the one contact window can be used not only for the contact between the tunneling resistor and the active device, but also for the contact between the tunneling resistor and the power supply or ground.

Thus in one aspect, the invention involves an article comprising an active device having at least one contact area and a load resistor electrically communicating with the contact area. The load resistor comprises a thin dielectric layer overlying the contact area. Electric current passes through the load resistor by quantum tunneling. As a consequence, the current-voltage characteristics of the load resistor do not obey Ohm's Law. Instead, the resistance of the load resistor (i.e., the ratio of the voltage drop across it to the electric current passing through it) decreases monotonically with applied voltage. (Although many electronic circuits, e.g., operational amplifier circuits, require resistors having linear current-voltage characteristics, such ohmic behavior is not required of the load resistors of transistors, such as cross-coupled inverter-pair transistors, that store data in memory cells. Such transistors operate only between conducting and non-conducting states, and the only constraint on the load resistors is to provide adequate voltage swing between conducting and non-conducting states.)

Because the tunneling resistor is deposited in a contact window, the effective chip area it occupies is typically only about one square, in contrast with a minimum of ten squares typically occupied by a polysilicon resistor. Moreover, the compatibility problem between highly doped polysilicon in contact areas and polysilicon resistors is eliminated, because dopants do not readily diffuse from polysilicon into dielectric (e.g., silicon dioxide) layers.

DETAILED DESCRIPTION

Figure 1:
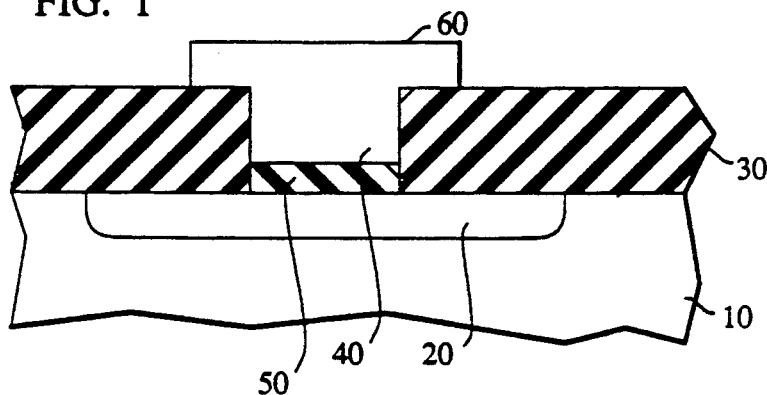
FIG. 1 is a schematic, cross-sectional view of a tunneling resistor formed in direct contact with a shallow source or drain, in accordance with one embodiment of the invention.

With reference to FIG. 1, in one embodiment, the invention involves a single-crystal silicon substrate 10, in which a shallow source or drain 20 has been formed by ion implanation or one of various other techniques well-known in the art of microelectronic fabrication. Such a source or drain may, for example, be part of an active device such as a MOSFET, or a bipolar transistor. A field oxide layer 30 is formed over at least a portion of the substrate, including source or drain 20, e.g., by oxidation or chemical vapor deposition, which are well-known in the art of microelectronic fabrication. Contact window 40 can be formed in field oxide layer 30 by reactive ion etching, as is well-known in the art. Significantly, window 40 extends all the way through layer 30, exposing the upper surface (i.e., the surface facing away from the underlying substrate) of region 20. Dielectric layer 50 is then formed overlying and in direct contact with region 20, within window 40. Dielectric layer 50 is preferably composed of silicon dioxide, because it can be conveniently grown by standard oxidation procedures. Alternatively, it can be readily formed by chemical vapor deposition. Alternatively to silicon dioxide, layer 50 is also readily made, for example, of silicon nitride. If it is composed of silicon nitride, layer 50 can be made by the method of chemical vapor deposition. After layer 50 is formed, contact 60, exemplarily consisting of heavily doped polysilicon, is formed within window 40. Contact 60 fills window 40 and partially overlies that portion of oxide layer 30 that is peripheral to window 40. Contact 60 typically is formed by the method of chemical vapor deposition. Such polysilicon contacts are well-known in the art in connection with the fabrication of microelectronic circuits.

Field oxide layer 30 should be 0.2 to 0.5 $\mu$m in thickness, and preferably about 0.3 $\mu$m in thickness, to avoid parasitic channel effects. Contact window 40 is preferably about 0.5 $\mu$m square. Polysilicon contact 60 should be doped with As, P, B, or any other appropriate dopant to a doping density of $10^{15}$ cm$^{-3}$ to $10^{22}$ cm$^{-3}$ and preferably a density of about $10^{20}$ cm$^{-3}$ to provide stability against segregation to grain boundaries. The area of dielectric layer 50 is determined by, and is essentially the same as, that of contact window 40. The thickness of layer 50 is determined by reference to the tunneling mechanism that characterizes it, and to the resistance that is desired at a given operating voltage. For VLSI applications, a useful range of operating voltages is from about 0.1 V to about 5 V, and a useful range of resistances is from about $10^7$ $\Omega$ to about $10^{16}$ $\Omega$. Layer 50 is generally required to be at least about 10 Å thick because it is difficult to grow substantially thinner layers with adequate integrity. Thicknesses greater than about 200 Å will in general have resistances that are too high to be useful in this context.

If, for example, layer 50 is composed of silicon dioxide, it is, more particularly, composed of amorphous silicon dioxide grown by oxidation. Such a layer will be essentially free of traps if it is grown under ultrapure conditions and properly annealed to maximize Si-O bond formation. By "essentially free" is meant a trap density of less than about $10^{10}$ cm$^{-2}$, because at such low densities, the total trapped charge has negligible effect on current transport. The transport of electric current through such an essentially trap-free layer is ideally dominated by the Fowler-Nordheim mechanism of quantum tunneling, described, for example, in Lenzlinger and Snow, *J. Appl. Phys.* 40, (1969) p. 278.

The Fowler-Nordheim expression for current density J as a function of electric field E and barrier height $\phi_0$ is $$J = \frac{q^2 E^2}{8\pi h \phi_0} e^{\frac{-0.0267\pi}{hE}(2qm^*)^{1/2}\phi_0^{3/2}},$$

where q is the electronic charge, h is Planck's constant, and m* is the effective mass of the electron.

Figure 2:
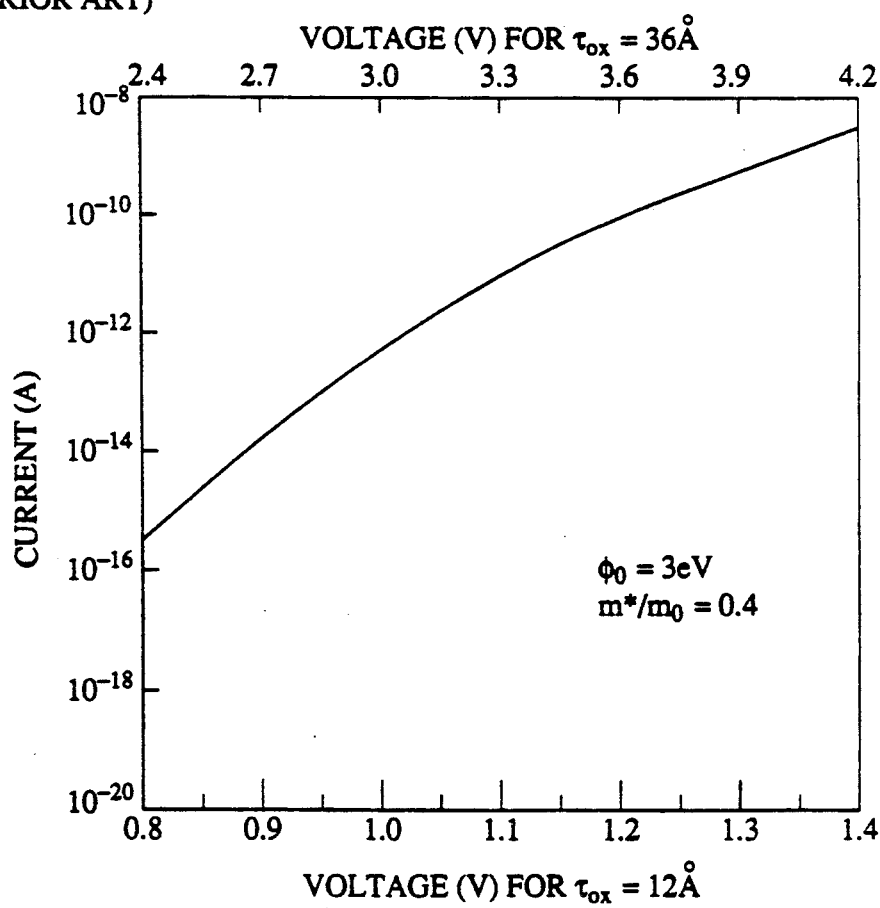
FIG. 2 is a semilogarithmic graph the theoretically predicted of current versus applied voltage for a typical tunneling resistor that obeys the Fowler-Nordheim model of tunneling.

Significantly, this expression is independent of temperature, and therefore indicates that tunneling resistors will be thermally stable. A graph of the current versus voltage characteristic predicted by the Fowler-Nordheim mechanism is depicted in FIG. 2. The graph of FIG. 2 represents a trap-free, thermally grown, silicon dioxide layer 36 Å or 12 Å in thickness and 1 $\mu$m square. The response of an actual such layer is expected to closely resemble the graph of FIG. 2, which is based on well-known theory. It is apparent from FIG. 2 that at an applied voltage of, e.g., 1.1 V, a 12 Å dielectric layer will conduct a current of $10^{-11}$ A. Thus at 1.1 applied volts, the effective resistance of a 12 Å dielectric layer is $1.1 \times 10^{11}$ ohms.

Alternatively, if dielectric layer 50 is composed of silicon dioxide formed by chemical vapor deposition, it will have a trap density of $10^{12}$ to $10^{14}$ cm$^{-2}$. In this case, the tunneling mechanism will be dominated by trap behavior. Instead of the Fowler-Nordheim mechanism, the appropriate model of current transport is the Poole-Frenkel mechanism, described, for example, in J. J. O'Dwyer, *Theory of Electrical Conduction and Breakdown in Solid Dielectrics*, Oxford University Press, (1973). A graph of the current versus voltage characteristic predicted by the Poole-Frenkel mechanism is dependent on trap depth and temperature. A dielectric layer with a Poole-Frenkel current transport mechanism may also be useful as a tunneling resistor.

Figure 3:
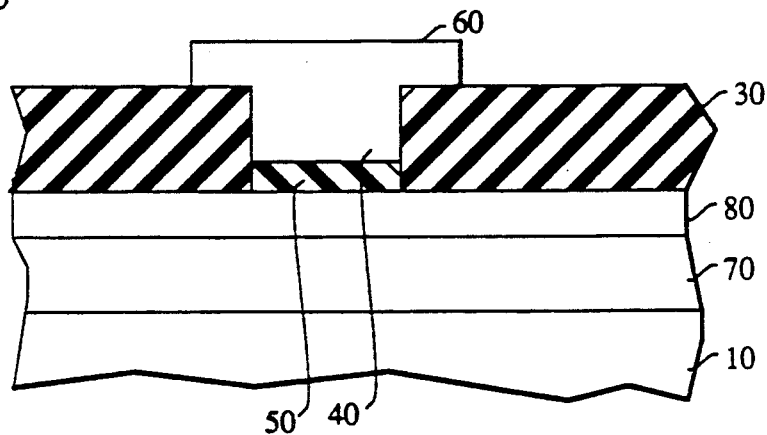
FIG. 3 is a schematic, cross-sectional view of a tunneling resistor overlying and in direct contact with a polysilicon layer, in accordance with a second embodiment of the invention.

Referring now to FIG. 3, in a second embodiment of the invention, a field oxide or inter-level dielectric layer 70 is formed directly on substrate 10, exemplarily by thermal oxidation. A polysilicon layer 80 is subsequently formed on layer 70, exemplarily by chemical vapor deposition. Such a polysilicon layer is typically highly doped, e.g., doped to a density of $10^{22}$ with As, P or B to make it conductive. Polysilicon layers such as layer 80 are used, for example, for the purpose of gate electrodes in devices such as MOSFETs. A tunneling resistor is then formed on layer 80 by the steps described above; i.e., by forming layer 30, then forming window 40, then growing or depositing dielectric layer 50 on layer 80, and then forming polysilicon contact 60.

Figure 4:
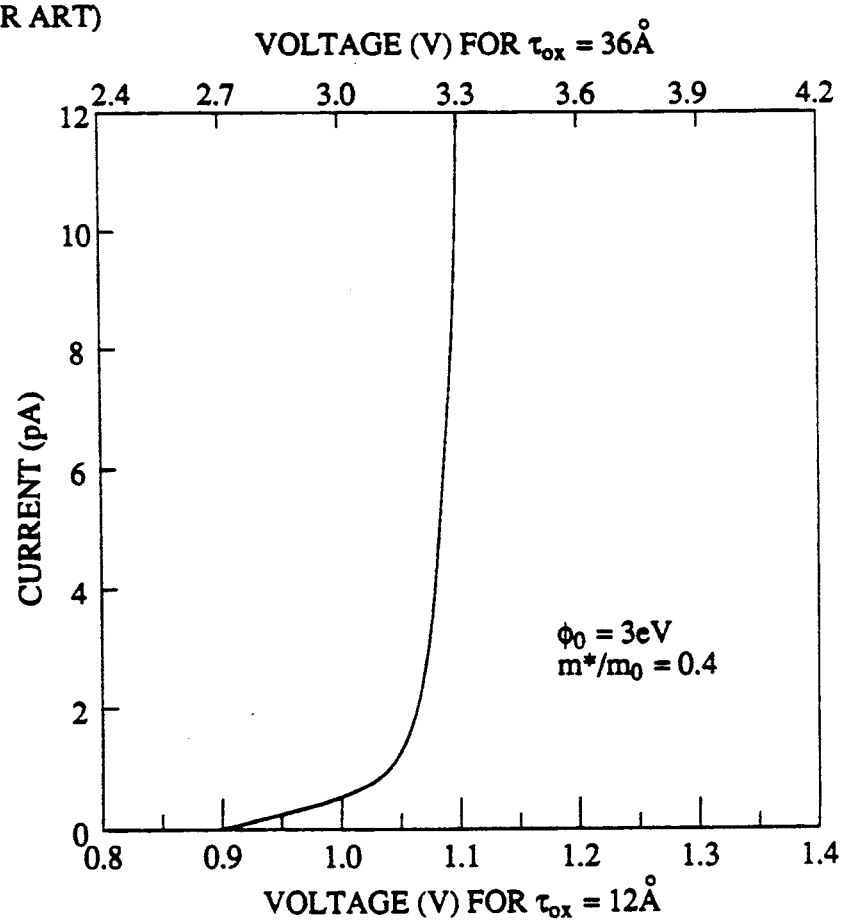
FIG. 4 is a linear plot of the theoretically predicted current current versus applied voltage for a tunneling resistor that obeys the Fowler-Nordheim model of tunneling.

The current versus voltage characteristic of a tunneling resistor similar to the resistor of FIG. 2, having a dielectric thickness of 12 Å or 36 Å, is shown in FIG. 4. Unlike FIG. 2, which is a semilogarithmic plot, FIG. 4 is a linear plot, in order to more clearly depict the threshold characteristics of the tunneling resistor. That is, the current passing through, e.g., the 12 Å tunneling resistor climbs very steeply at applied voltages greater than about 1.1 V. Thus, the 12 Å tunneling resistor has a threshold region extending from about 1.0 V to about 1.1 V. Currents that flow in response to voltages below the threshold region are much smaller, potentially by many orders of magnitude, than currents that flow in response to voltages lying above the threshold region. According to a third embodiment of the invention, this threshold behavior can be put to use in a tunneling switch.

Figure 5:
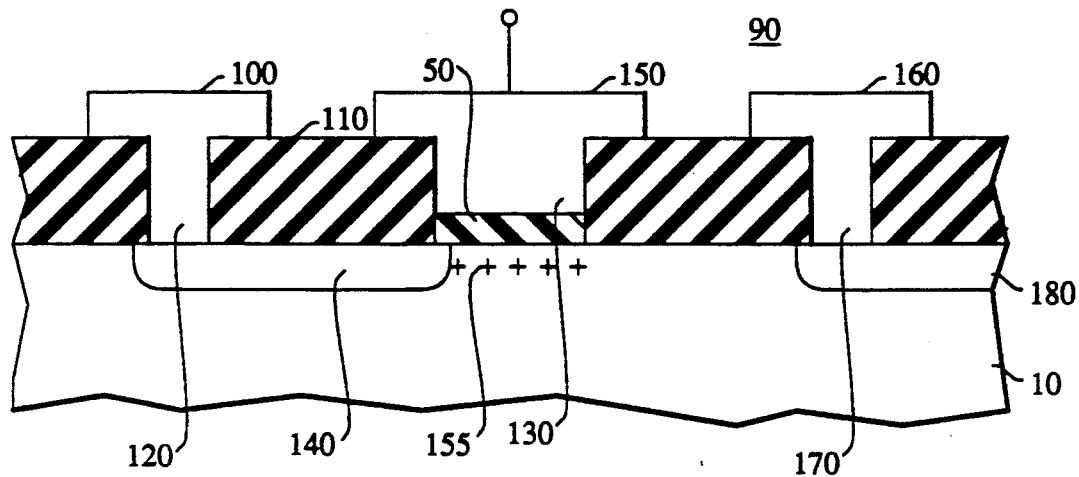
FIG. 5 is a schematic, cross-sectional view of a tunneling switch, in accordance with a third embodiment of the invention.

That is, with reference to FIG. 5, a tunneling switch 90 is made by forming dielectric layer 50 on a region of substrate 10 lying an effective distance (to be defined below) from control contact 100. For this purpose, substrate 10 is, for example, lightly doped n-type silicon, i.e., silicon doped to a density lying between $10^{14}$ and $10^{16}$ cm$^{-3}$. A layer of field oxide 110 overlies at least a portion of the substrate, and at least two contact windows 120 and 130 are formed, extending through the field oxide layer. Dielectric layer 50 is formed within contact window 130, as described above. Prior to the formation of the contact windows, p+ diffusion region 140 is formed in substrate 10 in a shallow region of the substrate underlying the region where window 120 is to be formed. Diffusion region 140 can be formed by the method of ion implantation and annealing as is well known in the art. After the contact windows are formed, heavily doped polysilicon is deposited, filling the contact windows and partially overlying the field oxide in areas peripheral to the windows. The polysilicon deposits form control contact 100, overlying the p+ diffusion region, and tunneling contact 150, overlying dielectric layer 50. The effective distance between the control contact and the tunneling contact is defined by the behavior of the junction between the diffusion region and the substrate. That is, when a positive voltage is applied to the control contact relative to the tunneling contact, an inversion layer 155 can form beneath dielectric layer 50. When this occurs, the electric field in layer 50 is increased, and the electric current passing through layer 50 is also increased. Conversely, when negative potential is applied to the control contact, a depletion layer can form under layer 50, reducing the field in the dielectric layer and substantially eliminating the electric current passing through it. Thus, an effective distance between the control contact and the tunneling contact is a distance such that a depletion layer is formed when the voltage on the control contact (relative to the tunneling contact) is within a desirable range for turning the tunneling switch OFF (i.e., for rendering the dielectric layer relatively nonconductive), and such that an inversion layer is formed when the voltage on the control contact is within a desirable range for turning the tunneling switch ON (i.e., rendering the dielectric layer relatively conductive). For logic circuit applications, OFF voltages typically lie in the range $-5$ to $+0.6$ and ON voltages typically lie in the range $+0.7$ to $+0.9$. The corresponding distance between the control contact and the tunneling contact is typically about 0.5 µm.

Electric current that passes from the tunneling contact, through dielectric layer 50, and into the substrate subsequently flows out of the substrate through, for example, contact 160, here called the substrate contact. Contact 160 is a heavily doped polysilicon contact filling contact window 170, and is formed in the same manner as contacts 100 and 150 except that the deposit is n-type. Contact 160 overlies a portion 180 of substrate 10 that is doped with P or As in the concentration range $10^{20}$ to $10^{22}$ cm$^{-3}$ to form an n+ diffusion region, analogous to p+ diffusion region 140.

Figure 6:
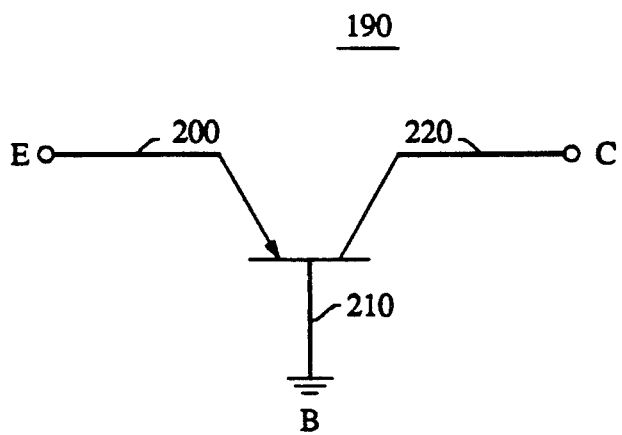
FIG. 6 is a schematic representation of a bipolar transistor.

In operation, tunneling switch 90, having three contacts 100, 150, and 160, is analogous to a bipolar transistor. That is, with reference to FIG. 6, when bipolar transistor 190 is configured in the common base mode, emitter 200 is analogous to tunneling switch contact 100, base 210 is analogous to contact 150, and collector 220 is analogous to contact 160. The transistor terminals are analogous to the corresponding contacts because the voltage applied to the emitter of the transistor controls the flow of electric current between the emitter and the collector. In fact, the analogy is very close because minority carriers are injected under the thin oxide 50 of the tunneling switch 90 in FIG. 5 in the same way as minority carriers are injected into the base 210 of the conventional bipolar transistor 190 in FIG. 6.

EXAMPLE

Figure 7:
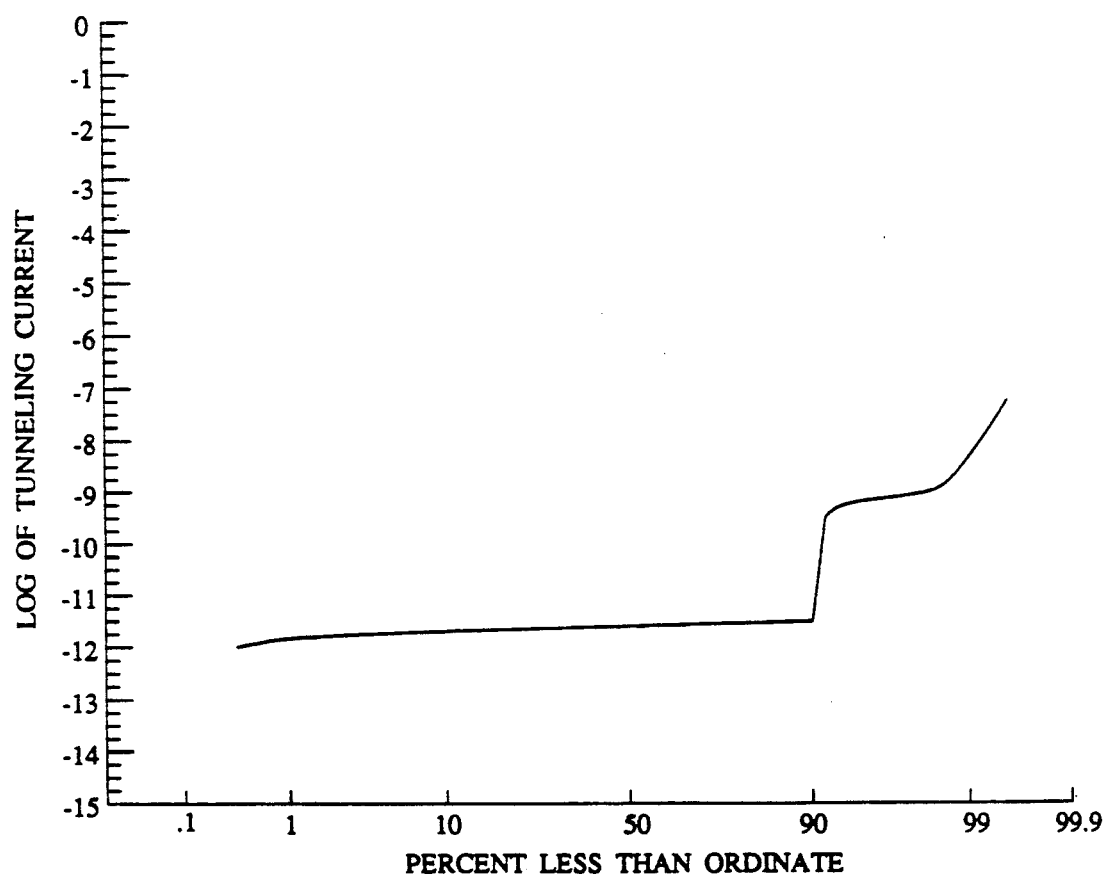
FIG. 7 is a statistical plot of a series of tunneling current measurements performed on an exemplary tunneling layer made according to the invention.

A thin oxide film was grown over a lightly doped n-type silicon wafer at 800° C. The thickness of the oxide film was measured by ellipsometry and found to be 47 Å. Approximately 2500 Å of undoped polysilicon was deposited over the oxide film and patterned using the POLY level of a MOS test mask set described, e.g., in J. M. Andrews, *Bell System Tech. J.* 62, p. 1107 (1983). This patterning step created 130 test points on the wafer. After applying a bias of 3.0 V for one minute, the tunneling current at each of the test points was measured, in sequence, at a bias of 3.0 V. At each point, the tunneling current was sampled ten times. The median value of the measured current was 2.64 pA, 85% of the measurements were below 2.83 pA, and 85% of the measurements were above 2.08 pA. The statistical analysis of the measurements is shown graphically in FIG. 7. The median tunneling current corresponds to a resistance of $1.14 \times 10^{12} \Omega$.

We claim:

1. A metal oxide semiconductor integrated circuit which comprises a silicon substrate, at least one two-terminal circuit element overlying at least a portion of the substrate, and at least one active device electrically connected to the circuit element, the circuit element having first and second contact regions and offering an electrical resistance greater than about $10^7$ ohms when a predetermined voltage greater than about 0.1 V is applied across the contact regions, characterized in that the circuit element comprises a first dielectric layer which is disposed between the contact regions such that essentially all direct electric current flowing between the contact regions is transported through the first dielectric layer by quantum tunneling;

the first contact region comprises a first polycrystalline silicon layer underlying and in direct contact with the first dielectric layer;

the second contact region comprises a heavily doped second polycrystalline silicon layer overlying and in direct contact with the first dielectric layer; and the active device is electrically connected to the circuit element through at least one of the polycrystalline silicon layers.

2. The circuit of claim 1, wherein the first dielectric layer comprises silicon dioxide or silicon nitride, and the thickness of the first dielectric layer is at least about 10 Å but not more than about 200 Å.

3. The article of claim 1, further comprising at least one active device electrically connected to the passive circuit element.

4. The circuit of claim 1, wherein the active device is a bipolar transistor having an emitter, a collector, and a base, and the passive circuit element is electrically connected to at least one of the emitter, the collector, and the base.

5. The circuit of claim 1, wherein the active device is a field-effect transistor having a source and a drain, and the passive circuit element is electrically connected to at least one of the source and the drain.

6. The circuit of claim 1, wherein the first dielectric layer comprises amorphous silicon dioxide.

7. The circuit of claim 1, wherein the passive circuit element has a surface area of not more than one square micrometer.

8. The circuit of claim 13, wherein:

the circuit further comprise a second dielectric layer overlying and in direct contact with the substrate; and the first polycrystalline silicon layer overlies and is in direct contact with at least a portion of the second dielectric layer.

* * * * *

UNITED STATES PATENT AND TRADEMARK OFFICE
CERTIFICATE OF CORRECTION

PATENT NO. : 5,140,299

DATED : Aug. 18, 1992

INVENTOR(S) : John M. Andrews, Jr.
San-Chin Fang

It is certified that error appears in the above-identified patent and that said Letters Patent is hereby corrected as shown below:

Column 8, lines 8-10, delete in its entirety.
Column 8, line 13, delete "passive".
Column 8, line 18, delete "passive".
Column 8, line 22, delete "passive".
Column 8, line 25, change "13" to --1--.

Signed and Sealed this

Twelfth Day of October, 1993

Attest:

BRUCE LEHMAN

*Attesting Officer*   *Commissioner of Patents and Trademarks*